United States Patent
In et al.

(10) Patent No.: US 7,526,600 B2
(45) Date of Patent: Apr. 28, 2009

(54) DATA MANAGEMENT DEVICE AND METHOD FOR FLASH MEMORY

(75) Inventors: Ji-hyun In, Seongnam-si (KR); Hyo-jun Kim, Seoul (KR); Kwang-yoon Lee, Seongnam-si (KR); Tae-sun Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 262 days.

(21) Appl. No.: 11/003,400

(22) Filed: Dec. 6, 2004

(65) Prior Publication Data

US 2005/0144421 A1    Jun. 30, 2005

(30) Foreign Application Priority Data

Dec. 26, 2003    (KR)    .................. 10-2003-0097486

(51) Int. Cl.
 *G06F 13/00* (2006.01)
(52) U.S. Cl. ....................... 711/103; 711/154
(58) Field of Classification Search ............ 711/103, 711/127, 156, 202, 203, 206, 209, 218, 154; 710/39, 40, 41; 358/1.15; 713/300
See application file for complete search history.

(56) References Cited

U.S. PATENT DOCUMENTS

| | | | |
|---|---|---|---|
| 4,183,090 A | | 1/1980 | Furukawa et al. |
| 5,630,093 A | | 5/1997 | Holzhammer et al. |
| 5,937,425 A | * | 8/1999 | Ban .......................... 711/103 |
| 6,112,265 A | | 8/2000 | Harriman et al. |
| 6,427,186 B1 | | 7/2002 | Lin et al. |
| 6,757,800 B1 | * | 6/2004 | Estakhri et al. ............. 711/168 |
| 6,760,805 B2 | * | 7/2004 | Lasser ....................... 711/103 |
| 6,839,826 B2 | * | 1/2005 | Cernea ...................... 711/202 |
| 6,895,464 B2 | * | 5/2005 | Chow et al. ................. 711/103 |
| 7,020,739 B2 | * | 3/2006 | Mukaida et al. ............. 711/103 |
| 7,024,514 B2 | * | 4/2006 | Mukaida et al. ............. 711/103 |
| 2002/0002653 A1 | * | 1/2002 | Lakhani et al. ............. 711/103 |

(Continued)

FOREIGN PATENT DOCUMENTS

JP    04-278651 A    10/1992

(Continued)

OTHER PUBLICATIONS

Nagib Callaos et al.: "The 6th World Multi-Conference on Systemics, Cybernetics and Informatics: A Proposal to Implement New-Value Logging in Java Card Transaction", Proceedings, vol. XVII, Industrial Systems and Engineering III, Jul. 14-18, 2002, Orlando, FL.

*Primary Examiner*—Kevin L Ellis
*Assistant Examiner*—Jared I Rutz
(74) *Attorney, Agent, or Firm*—Sughrue Mion PLLC

(57) ABSTRACT

A data management device and a data management method for a flash memory, in which physical addresses are classified according to pages, each of which is a physical data operation unit, and a predetermined data operation is performed with respect to the classified physical addresses. The data management device and method reduce time required for the data operation in a large-block flash memory, in which a physical data operation unit is larger than a logical data operation unit. As a result, an optimal data operation can be achieved in a large-block flash memory.

16 Claims, 14 Drawing Sheets

U.S. PATENT DOCUMENTS

| | | | |
|---|---|---|---|
| 2002/0013879 A1* | 1/2002 | Han | 711/103 |
| 2002/0194451 A1* | 12/2002 | Mukaida et al. | 711/203 |
| 2003/0028704 A1* | 2/2003 | Mukaida et al. | 711/5 |
| 2003/0046484 A1* | 3/2003 | Lasser | 711/103 |
| 2003/0135688 A1* | 7/2003 | Tai et al. | 711/103 |

FOREIGN PATENT DOCUMENTS

| | | |
|---|---|---|
| JP | 09-091975 A | 4/1997 |
| JP | 9-161491 A | 6/1997 |
| JP | 2002-123430 A | 4/2002 |
| KR | 1999-0079321 A | 11/1999 |
| KR | 2001-0005824 A | 1/2001 |

* cited by examiner

FIG. 4A  (RELATED ART)

| LOGICAL ADDRESS 0 | LOGICAL ADDRESS 3 | | |
|---|---|---|---|
| LOGICAL ADDRESS 4 | LOGICAL ADDRESS 1 | | |
| | LOGICAL ADDRESS 5 | LOGICAL ADDRESS 2 | |
| ⋮ | | | |

| LOGICAL ADDRESS | PHYSICAL ADDRESS |
|---|---|
| 0 | 0 |
| 1 | 5 |
| 2 | 10 |
| 3 | 1 |
| 4 | 4 |
| 5 | 9 |

DATA MANAGEMENT DEVICE AND METHOD FOR FLASH MEMORY

CROSS-REFERENCE TO RELATED APPLICATION

This application claims priority from Korean Patent Application No. 10-2003-0097486 filed on Dec. 26, 2003 in the Korean Intellectual Property Office, the disclosure of which is incorporated herein by reference in its entirety.

BACKGROUND OF THE INVENTION

1. Field of the Invention

The present invention relates to a data management device and a data management method for a large-block flash memory, which can improve inefficient data operation of the flash memory, which may be caused because a logical data operation unit is smaller than a physical data operation unit in a large-block flash memory.

2. Description of the Prior Art

In general, flash memories may be used as storage media for storing and processing data in embedded systems, such as electric home appliances, communication devices, set-top boxes, etc.

The flash memory is a nonvolatile storage device which data can be electrically erased from and rewritten into. As compared with storage media based on magnetic disk memories, the storage medium based on such a flash memory has an access time as fast as that of a hard disk while causing a smaller power consumption, and is suitable for portable devices owing to its small size.

In the flash memory, when new data are overwritten on pre-written data, a process of erasing the whole block, in which the pre-written data are stored, is required due to a hardware characteristic of the flash memory.

In order to prevent the performance deterioration of the flash memory, which may occur due to discordance between a data writing unit and a data erasure unit in the flash memory, concepts of a logical address and a physical address are introduced.

Herein, the logical address is an address used when a user requests a data operation, such as data reading, data writing, etc., in the flash memory through a predetermined user program, and the physical address is an address used when the flash memory actually performs the data operation, such as data reading, data writing, etc.

Flash memories are generally classified into small-block flash memories and large-block flash memories. The small-block flash memory has a characteristic that the size of an actually physical data operation unit is identical to that of a logical data operation unit, but the large-block flash memory has a characteristic that the size of an actually physical data operation unit is larger than that of a logical data operation unit.

As shown in FIG. 1, a general large-block flash memory includes a sector 11 which is a logical data operation unit, a page 12 which is a physical data operation unit, and a block 13 which is a data erasure unit.

One page in the large-block flash memory includes a plurality of sectors, while one page in the small-block flash memory includes only one sector.

As shown in FIG. 2, data management device of a large-block flash memory includes a user request section 21 for requesting a data operation of the flash memory using a predetermined logical address, a converting section 22 for converting the logical address, which is used when the data operation is requested, into a physical address by means of a mapping table, and an operating section 23 for performing a predetermined data operation in the flash memory through a device driver 24, which controls the operation of the flash memory according to the converted physical address.

In the following description, the operation of the data management device of the large-block flash memory having the above-mentioned construction will be explained with reference to FIG. 3. First, a user requests a data operation of the flash memory using a predetermined logical address (operation S1).

In this case, the user may request the data operation by means of a predetermined user program included in the user request section 21.

The logical address is converted into a physical address of the flash memory by a predetermined mapping table in the converting section 22 (operation S2).

The operating section 23 controls the device driver 24, which controls the operation of the flash memory, by the converted physical address, so that the data operation requested by the user is performed (operation S3).

Then, it is judged whether or not a data operation of all logical addresses used by the user has been completed (operation S4). As a result of the judgment, if the data operation of all logical addresses used by the user has not been completed, the next logical address is converted into a corresponding physical address (operation S5), operation S3 of performing the data operation is again performed with respect to the converted physical address.

That is, in the case of the large-block flash memory, when sectors, which are physical addresses corresponding to logical addresses used when the user requests a data operation, are included in different pages from each other, the operating section 23 accesses each page including each physical address according to the sequence of the physical addresses and performs the data operation.

Therefore, even when multiple physical addresses are included in the same page, if they are not sequential addresses, the operating section 23 repeatedly accesses the same page to perform a data operation.

In the following description, a data reading operation performed by the operating section 23 will be explained as an example of data operations.

First, if logical addresses used by the user are logical address '0' to logical address '5' and physical addresses corresponding to the logical addresses are positioned as shown in FIG. 4A, the operating section 23 performs the data operation first with respect to a physical address corresponding to logical address '0', and then with respect to the respective physical addresses of logical address '1', logical address '2', logical address '3', logical address '4', and logical address '5', in regular sequence.

That is, as shown in FIG. 4B, the operating section 23 accesses the respective pages including each physical address corresponding to each logical address in regular sequence, and performs the data operation with respect to the physical addresses corresponding to each logical address.

Here, even when multiple physical addresses exist in one page, if they are not sequential addresses, the operating section 23 performs the data operation with respect to only one physical address in a corresponding sequence.

Therefore, in order to perform data operation with respect to all of logical address '0' to logical address '5', it is necessary to perform page access six times in total.

That is, even when multiple physical addresses are included in the same page, if they are not sequential addresses, the data management device of the flash memory, as described above, repeatedly accesses the same page to perform the data operation of the respective physical addresses.

Therefore, the time required for a data operation increases due to repeated accesses to the same page, which deteriorates the performance of the flash memory.

SUMMARY OF THE INVENTION

Accordingly, the present invention provides a data management device and a data management method for a flash memory which can perform an optimal data operation, by performing the data operation with respect to physical addresses included in the same page through only one page access.

According to an exemplary embodiment of the present invention, there is provided a data management device for a flash memory, the data management device comprising: a converting section for converting logical addresses into physical addresses; a rearrangement section for classifying and rearranging the physical addresses for each of physical data operation units; and an operating section for extracting the rearranged physical addresses in a physical data operation unit and performing a predetermined data operation with respect to the extracted physical addresses.

The rearrangement section may create an address list in which address information including the converted physical addresses and corresponding logical addresses are arranged according to the sequence of the physical addresses.

The rearrangement section may classify the address information included in the address list according to pages.

The operating section may erase address information extracted for the data operation from the address list.

In accordance with another exemplary embodiment of the present invention, there is provided a method of managing data in a flash memory, the method comprising: a) converting logical addresses into physical addresses; b) rearranging the converted physical addresses according to the sequence of the physical addresses; and c) classifying the rearranged physical addresses in a physical data operation unit.

Step b) may comprise creating address information including the converted physical addresses and corresponding logical addresses; and creating an address list in which the created address information is arranged according to the sequence of the converted physical addresses.

The method may further comprise: d) extracting address information in a physical data operation unit; and e) performing a data operation with respect to physical addresses corresponding to the extracted address information.

Step e) may further comprise erasing address information used through the data operation from the address list.

BRIEF DESCRIPTION OF THE DRAWINGS

The above and other objects, features and advantages of the present invention will be more apparent from the following detailed description taken in conjunction with the accompanying drawings, in which:

FIG. 4A is a view showing logical addresses and physical addresses converted by a mapping table;

DETAILED DESCRIPTION OF THE EXEMPLARY EMBODIMENTS

Figure 1:
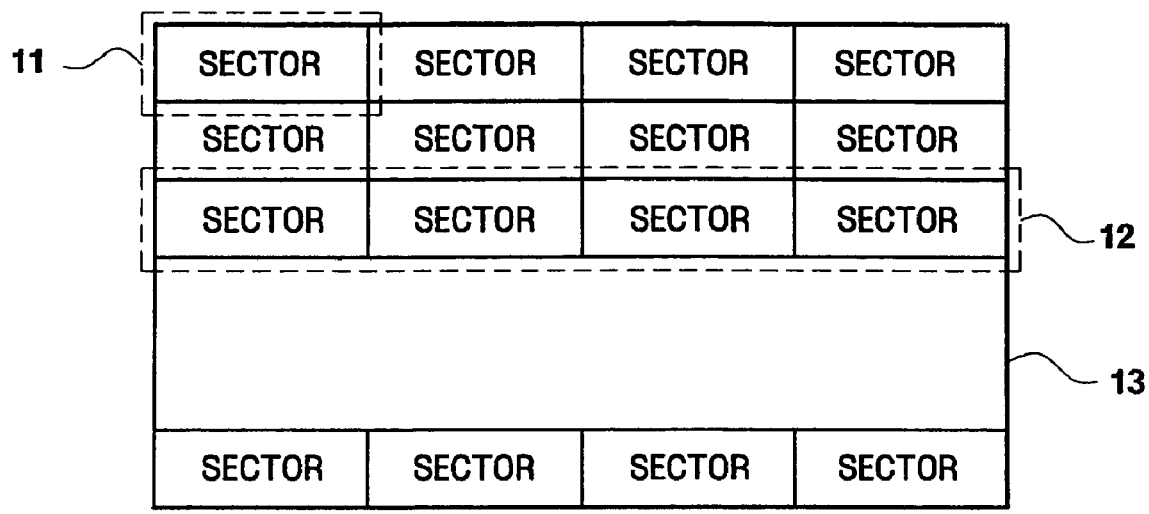
FIG. 1 is a view showing a structure of a general large-block flash memory.
Figure 2:
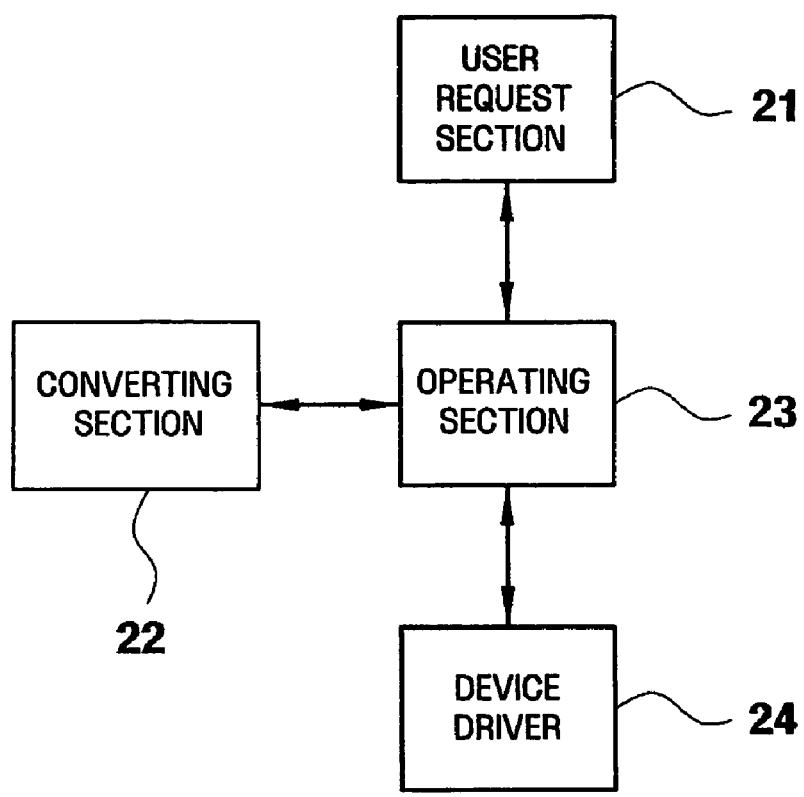
FIG. 2 is a block diagram showing a conventional data management device for a flash memory.
Figure 3:
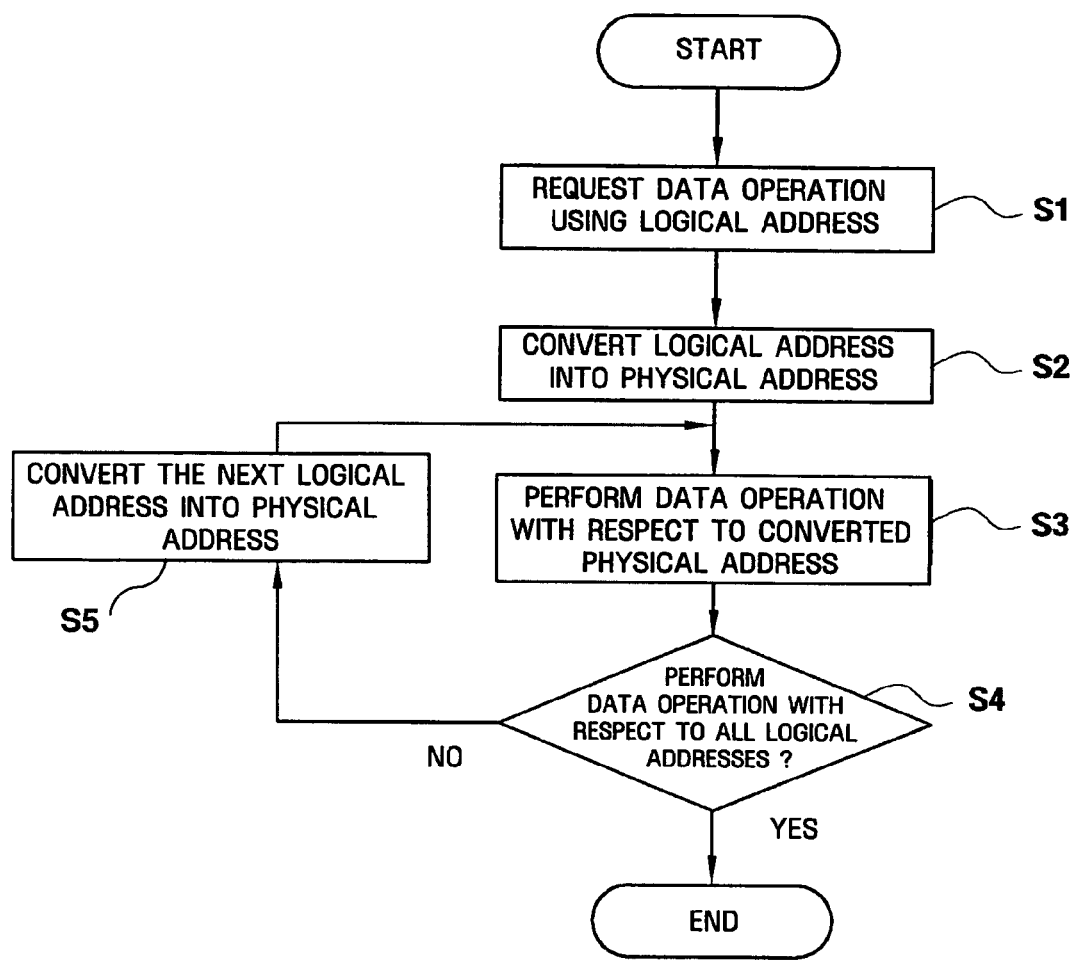
FIG. 3 is a flowchart for explaining a conventional data management method for a flash memory.
Figure 4B:
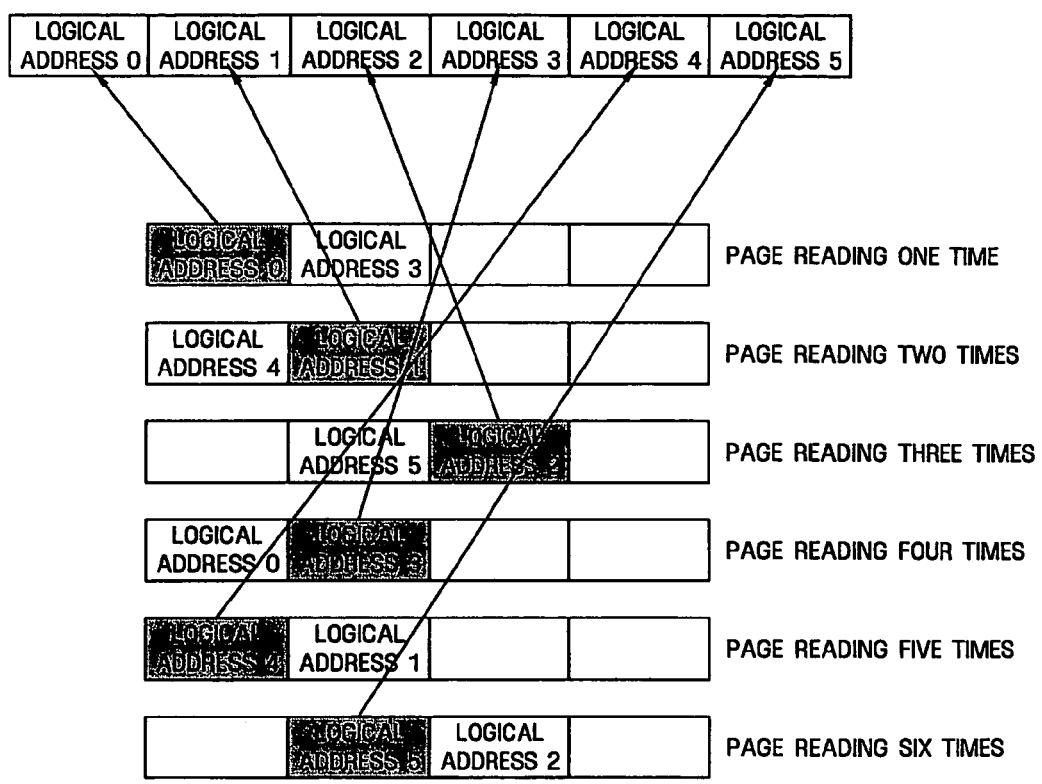
FIG. 4B is a view for showing a conventional data reading operation of a flash memory.

Hereinafter, exemplary embodiments of the present invention will be described in detail with reference to the accompanying drawings. Advantages and features of the present invention, and methods for achieving them will be apparent to those skilled in the art from the detailed description of the exemplary embodiments together with the accompanying drawings. However, the scope of the present invention is not limited to the exemplary embodiments disclosed in the specification, and the present invention can be realized in various types. The described exemplary embodiments are presented for helping those skilled in the art to understand the scope of the present invention, and the present invention is defined only by the scope of the claims. Additionally, the same reference numerals are used to designate the same elements throughout the specification and drawings.

In general, flash memories are classified into small-block flash memories and large-block flash memories.

The small-block flash memory has a characteristic that the size of a page, which is an actually physical data operation unit, is identical to that of a sector, which is a logical data operation unit. In contrast, the large-block flash memory has a characteristic that the size of a page, which is an actually physical data operation unit, is larger than that of a sector, which is a logical data operation unit.

Herein, the sector is a logical data operation unit used when a user performs data operations, such as a data reading operation, a data writing operation, etc., in the flash memory by means of a predetermined user program.

The page, which is a physical data operation unit used when a data operation is actually performed in the flash memory, includes an operation unit for reading data from the flash memory and an operation unit for writing data into the flash memory.

The physical data operation unit is not limited to the page, but may be defined in various sizes, for example, a block, according to used devices.

Figures 5, 6:
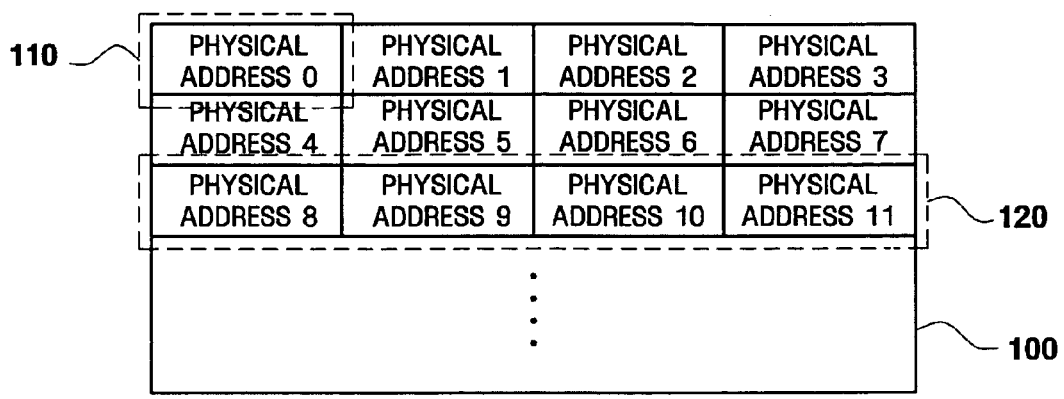
FIG. 5 is a view showing a structure of a flash memory utilized according to an exemplary embodiment in the present invention.
FIG. 6 is a view showing a mapping table employed in an exemplary embodiment of the present invention.

As shown in FIG. 5, the large-block flash memory includes a block 100, wherein the block 100 includes a plurality of pages 120, and each page 120 includes a plurality of sectors 110.

In the exemplary embodiment, it is assumed that the page 120 has a size four times larger than that of sector 110, that is, each page 120 has a size of 2 Kbytes when the sector has a size of 512 bytes.

Herein, the sector 110 is a logical data operation unit, and the page 120 is a physical data operation unit.

The user requests a predetermined data operation to the flash memory using logical addresses, and the logical addresses may be mapped on predetermined sectors in the flash memory.

That is, when physical addresses are established, as shown in FIG. 5, with respect to predetermined sectors, the respective logical addresses may be mapped so as to correspond to the physical addresses using a predetermined mapping table as shown in FIG. 6.

Therefore, when a user requests a data operation using a predetermined logical address, the data operation is performed with respect to a physical address corresponding to the logical address according to the mapping table in the flash memory.

The data operation is performed with respect to physical addresses corresponding to logical addresses requested by the user. In this case, even when multiple physical addresses are included in the same page, the data operation is performed in the sequence of the logical addresses, so that separate data operation must be performed with respect to each of the logical addresses, and thus it becomes impossible to perform an optimal data operation.

Figure 7:
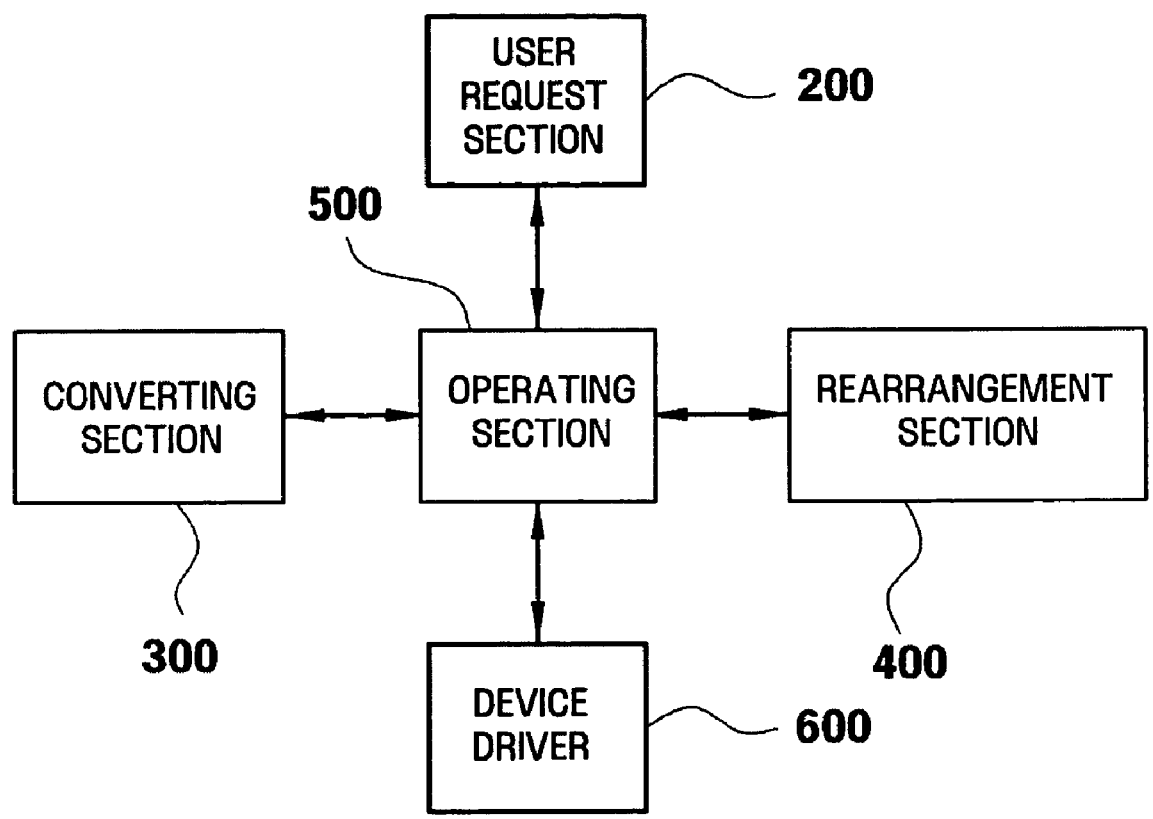
FIG. 7 is a block diagram showing a data management device of a flash memory according to an exemplary embodiment of the present invention.

FIG. 7 is a block diagram showing a data management device of a flash memory according to an exemplary embodiment of the present invention.

As shown in FIG. 7, the data management device includes a user request section 200, a converting section 300, a rearrangement section 400, an operating section 500, and a device driver 600. The user request section 200 is used when a user requests a data operation using predetermined logical addresses. The converting section 300 converts the requested logical addresses into physical addresses by means of the mapping table. The rearrangement section 400 checks pages including the converted physical addresses, and rearranges the sequence of the physical addresses according to the sequence of the pages. The operating section 500 extracts physical addresses from each of the corresponding pages including the rearranged physical addresses and then performs a predetermined data operation for the extracted physical addresses. The device driver 600 controls the operation of the flash memory, and performs an actual data operation with respect to relevant physical addresses according to the control the operating section 500.

Herein, the user request section 200 includes a user program which enable a user to request a predetermined data operation using the logical addresses.

The converting section 300 includes a mapping table needed when logical addresses used by the user are converted into corresponding physical addresses.

Physical addresses converted by the converting section 300 are transferred with corresponding logical addresses to the rearrangement section 400. The rearrangement section 400 creates address information which includes the converted physical addresses and the corresponding logical addresses, and creates an address list by arranging the address information according to the sequence of the physical addresses.

After this, the operating section 500 extracts address information according to pages from the address list rearranged by the rearrangement section 400, and reads the extracted address information according to pages to perform a data operation for relevant physical addresses.

At this time, address information corresponding to physical addresses having undergone the data operation may be erased from the address list.

A data management method of the flash memory having the above-mentioned construction according to the present invention is as follows.

Figure 8:
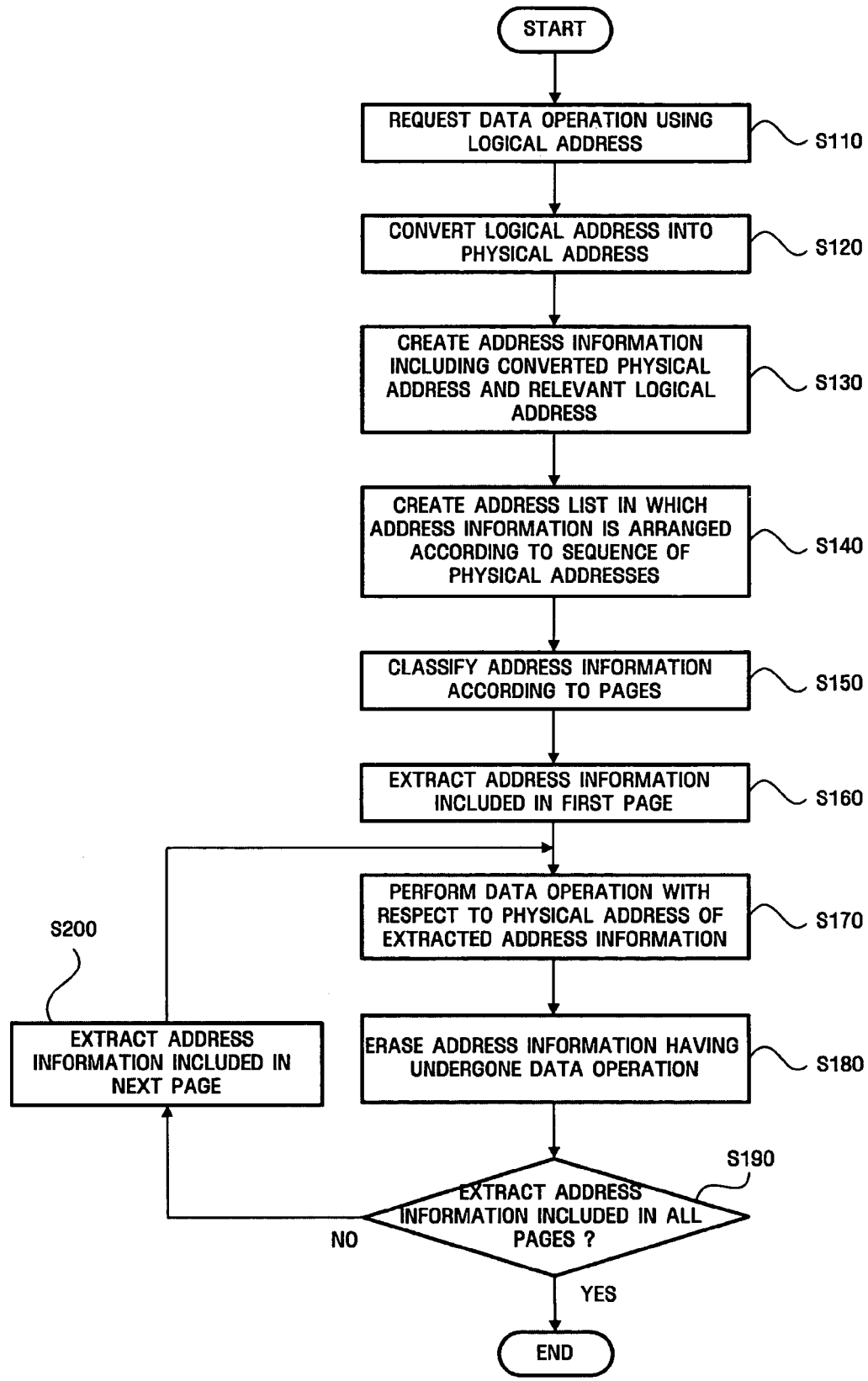
FIG. 8 is a flowchart for explaining a data management method of a flash memory according to an exemplary embodiment of the present invention.

According to the data management method of the flash memory in accordance with an exemplary embodiment of the present invention, as shown in FIG. 8, first, a user requests a data operation of the flash memory using predetermined logical addresses (operation S110).

Herein, when the flash memory is a small-block flash memory, the requested logical address is identical to the physical address actually used for a data operation because a logical data operation unit is identical to a physical data operation unit.

However, when the flash memory is a large-block flash memory, a logical data operation unit is smaller than a physical data operation unit, so that a process of converting the requested logical addresses into physical addresses is required.

The present embodiment will be explained with respect to the case in which the flash memory is a large-block flash memory.

When the requested logical addresses have been transferred to the converting section 300, the logical addresses are converted into physical addresses, which are actually used for a data operation in the flash memory, by means of the mapping table (operation S120).

The converted physical addresses and corresponding logical addresses are transferred to the rearrangement section 400, and the rearrangement section 400 creates address information including the converted physical addresses and the corresponding logical addresses (operation S130).

Herein, the address information includes logical address used by the user and physical addresses corresponding to the logical addresses in the mapping table.

The rearrangement section 400 rearranges the created address information according to the sequence of the converted physical addresses, thereby creating an address list (operation S140).

Figure 9:
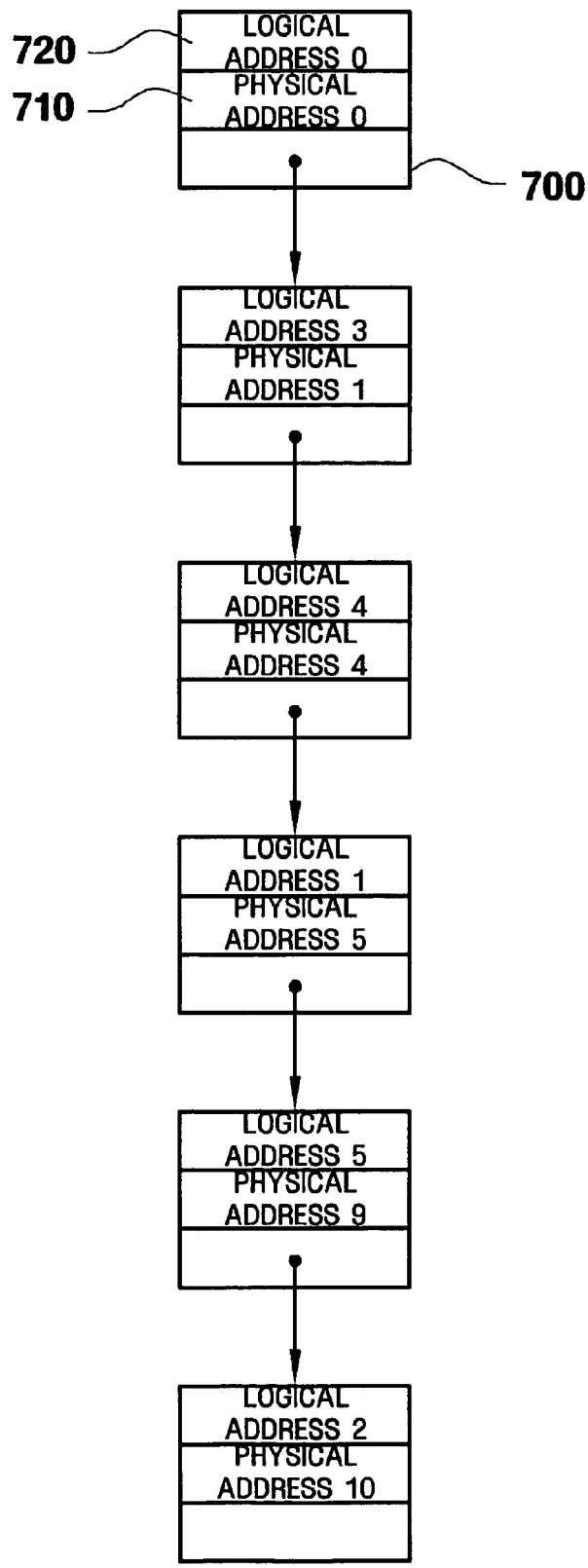
FIG. 9 is a view showing an example of an address list according to an exemplary embodiment of the present invention.

As shown in FIG. 9, the address list contains address information 700 which includes physical addresses 710, which have been converted by the converting section 300, and corresponding logical addresses 720, and are arranged according to the sequence of the physical addresses 710.

After having rearranging the address list, the rearrangement section 400 classifies the address information, which is included in the address list, according to pages, each of which is a physical data operation unit (operation S150).

Figure 10:
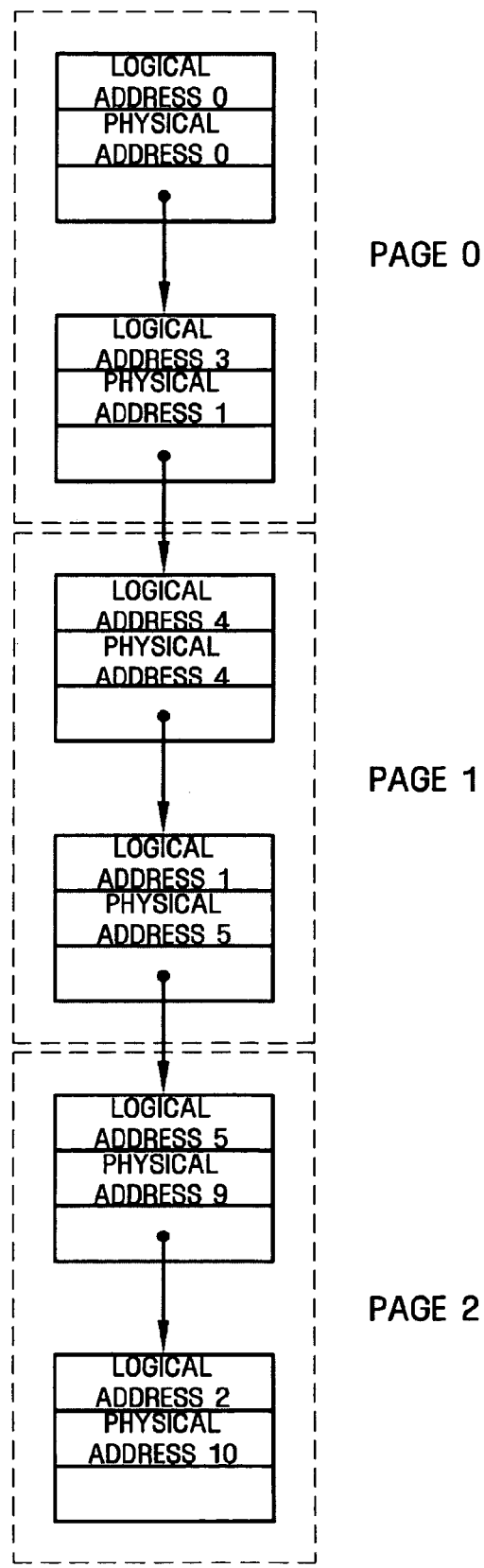
FIG. 10 is a view showing an example in which address information included in an address list is classified according to pages according an exemplary embodiment of to the present invention.

That is, as shown in FIG. 10, the address information included in the address list created by the rearrangement section 400 is classified by the page according to physical addresses included in the address information.

After this, the operating section 500 extracts address information included in a first page, that is, page '0', from among the address information included in the address list (operation S160), and performs the data operation requested by the user with respect to physical addresses of the extracted address information (operation S170).

The address information having undergone the data operation is erased from the address list (operation S180), and it is judged whether or not all address information included in the address list has been extracted (operation S190).

As a result of the judgment, if all address information included in the address list has not been extracted, address information included in the next page is extracted (operation S200) to repeat steps 170 and 180 of performing the data operation with respect to the extracted address information.

At this time, address information extracted for the data operation may be erased from the address list after the data operation is performed.

Hereinafter, the above-mentioned data management method of the flash memory will be described with respect to a data reading operation and a data writing operation as preferred examples of data operations.

Figure 11:
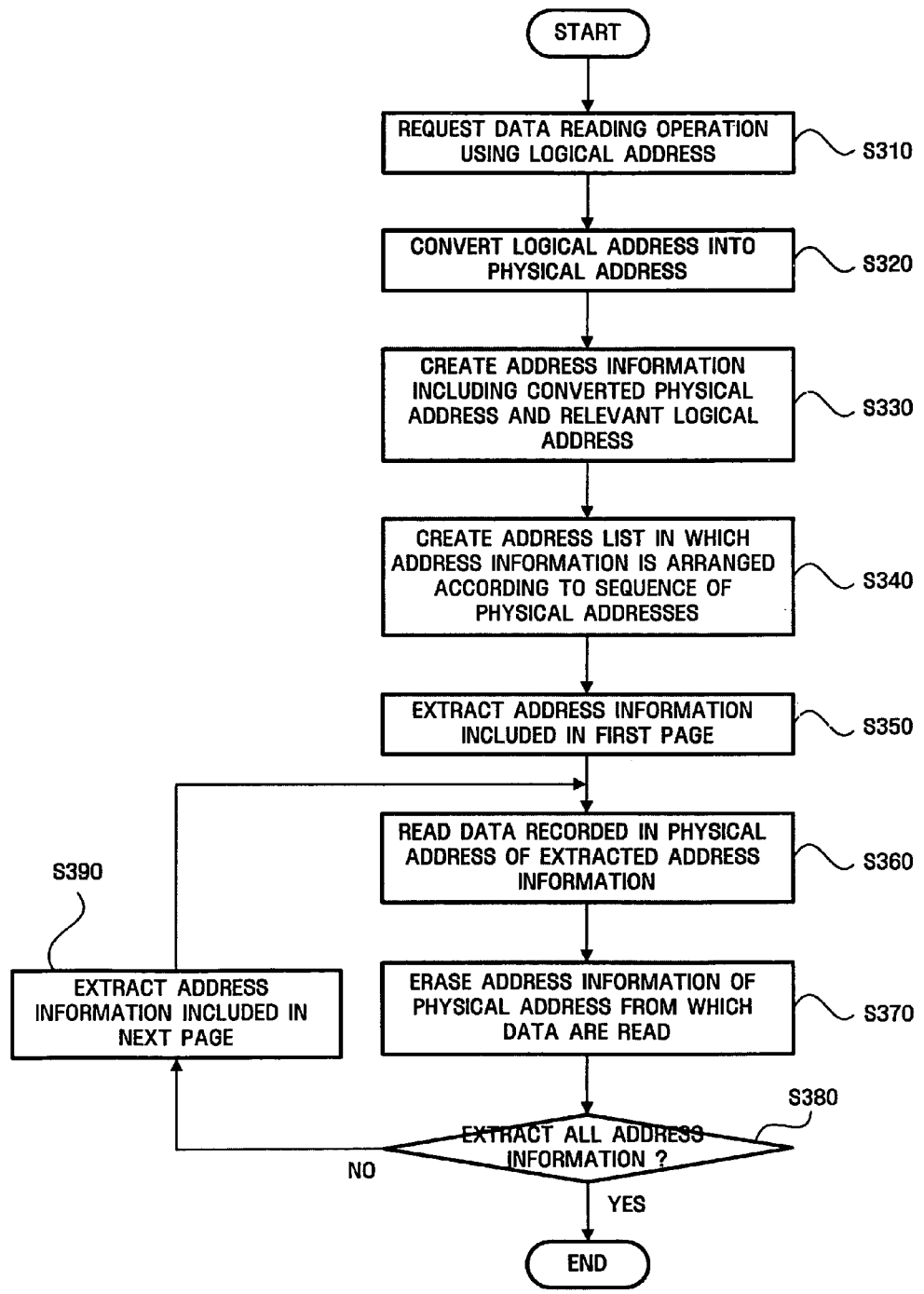
FIG. 11 is a flowchart for explaining a data reading operation method of a flash memory according to an exemplary embodiment of the present invention.

First, in the case of the data reading operation, as shown in FIG. 11, a user requests a data reading operation using logical addresses (operation S310).

The logical addresses are converted into physical addresses by the mapping table in the converting section 300 (operation S320).

The converted physical addresses and corresponding logical addresses are transferred to the rearrangement section 400, and the rearrangement section 400 creates address information including the converted physical addresses and the corresponding logical addresses (operation S330).

Also, the rearrangement section 400 rearranges the created address information according to the sequence of the physical addresses, thereby creating an address list (operation S340).

The operating section 500 extracts address information having physical addresses included in a first page from among the address list (operation S350).

After this, the operating section 500 reads data recorded in the physical addresses which are included in the extracted address information (operation S360).

The address information, from which the data have been read, is erased from the address list (operation S370), and then it is judged whether or not all address information included in the address list has been extracted (operation S380).

As a result of the judgment, if there is any address information which is not extracted from the address list, it is regarded that address information included in the next page exists, and the address information included in the next page is extracted (operation S390).

After this, operations S360 and S370 of reading data recorded in physical addresses of the extracted address information are repeatedly performed, together with the operation of extracting address information according to pages, until all address information included in the address list are extracted.

Figure 12:
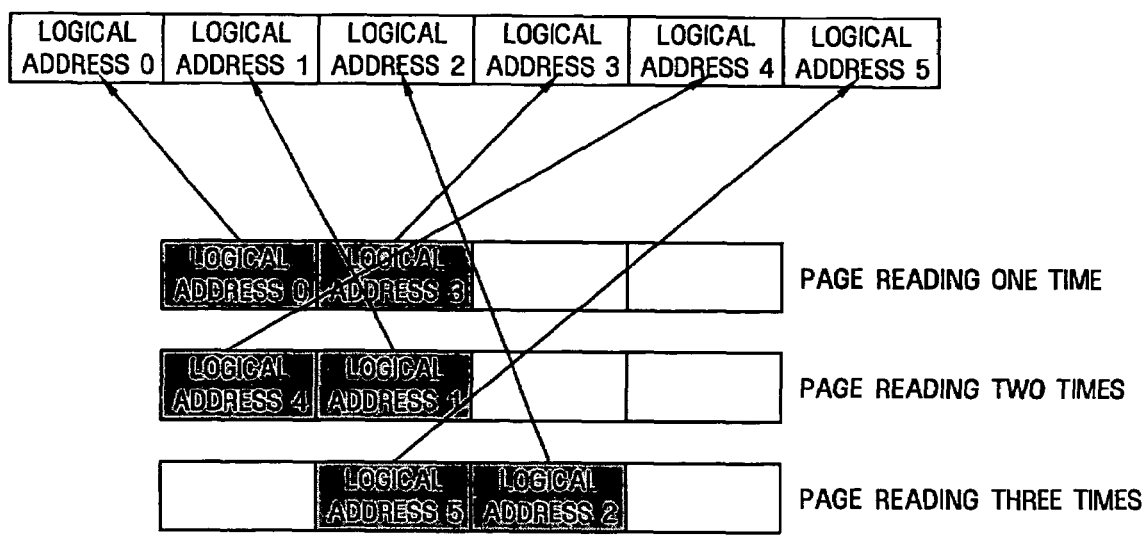
FIG. 12 is a view for explaining a page reading process in a data reading operation of a flash memory according to an exemplary embodiment of present invention.

The data reading operation described above will be described in detail with reference with FIG. 12.

When logical addresses used by a user are logical address '0' to logical address '5', logical address '0' to logical address '5' are all included in three pages according to the mapping table.

Therefore, the operating section 500 extracts address information having physical addresses according to pages from the address list, thereby reading data recorded in relevant physical addresses through only three repetitions of page accesses.

Figure 13:
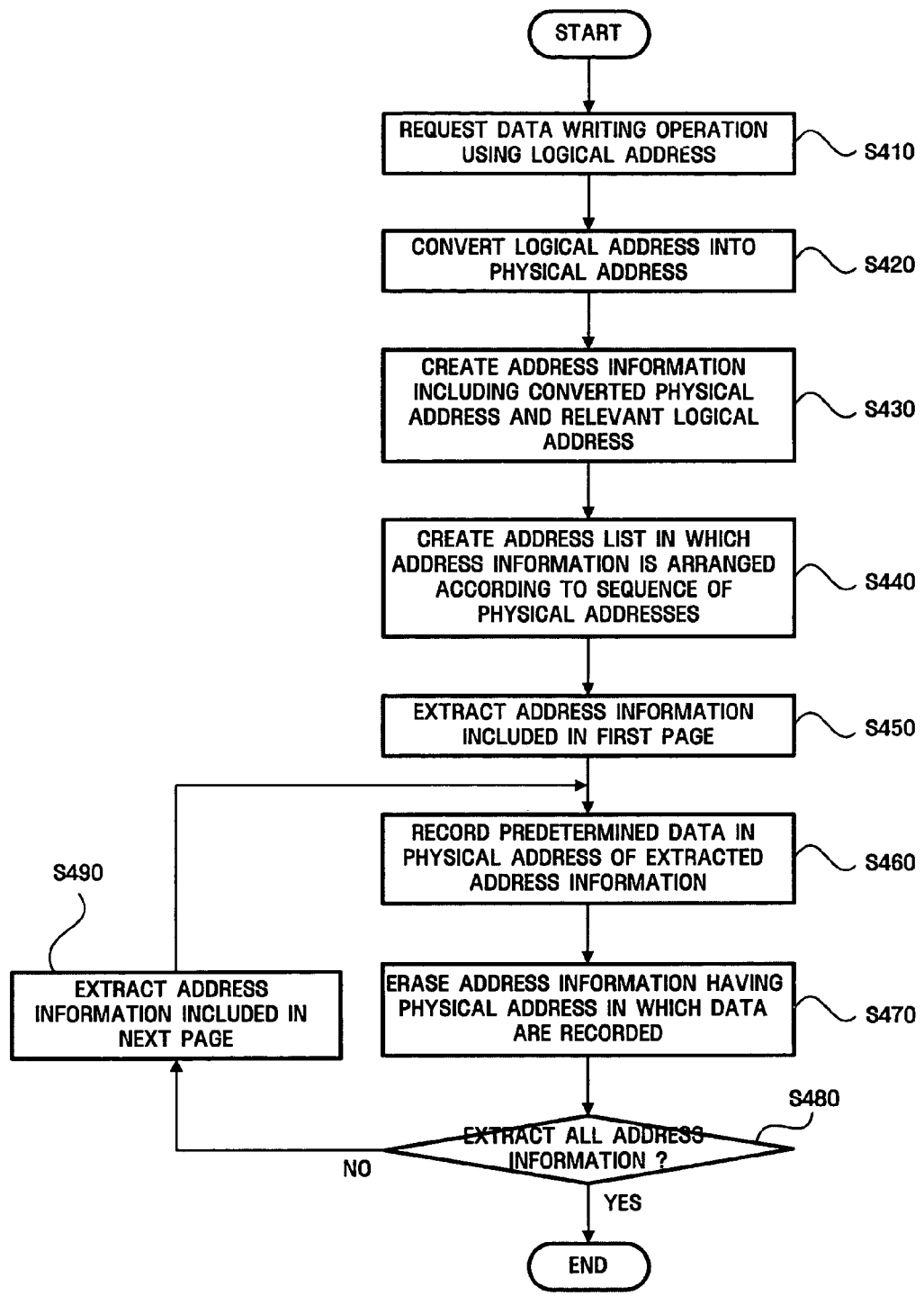
FIG. 13 is a flowchart for explaining a data writing operation method of a flash memory according to an exemplary embodiment of the present invention.

On the other hand, in the case of the data writing operation, as shown in FIG. 13, a user requests a data writing operation, using logical addresses for performing the data writing operation (operation S410).

The logical addresses used for the data writing operation are converted into physical addresses for the flash memory by the mapping table in the converting section 300 (operation S420).

The converted physical addresses and corresponding logical addresses are transferred to the rearrangement section 400, and the rearrangement section 400 creates address information including the converted physical addresses and the corresponding logical addresses (operation S430).

The rearrangement section 400 rearranges the created address information according to the sequence of the physical addresses included in the address information, thereby creating an address list (operation S440).

The operating section 500 classifies the address information included in the created address according to pages, and extracts address information included in a first page (operation S450).

Predetermined data are recorded in physical addresses of the extracted address information (operation S460).

The address information having the physical addresses on which recording of the data has been completed is erased from the address list (operation S470).

After this, it is judged whether or not all address information included in the address list has been extracted (operation S480). As a result of the judgment, if there is any address information which is not extracted from the address list, it is regarded that address information included in the next page exists, and the address information included in the next page is extracted (operation S490).

Then, operations S460 and S470 of writing predetermined data into physical addresses of the extracted address information are repeatedly performed, together with the operation of extracting address information according to pages, until all address information included in the address list are extracted.

Figure 14:
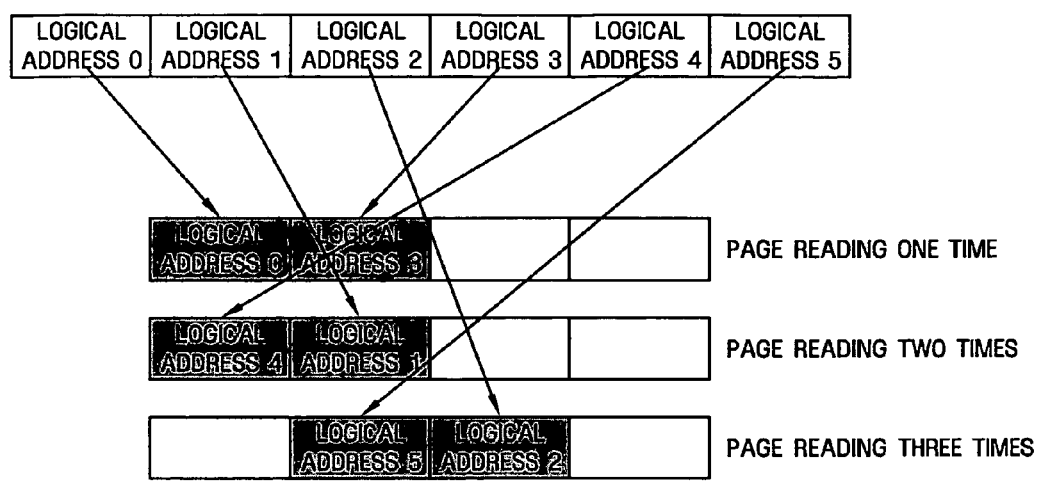
FIG. 14 is a view for explaining a page writing process in a data writing operation of a flash memory according to an exemplary embodiment of present invention.

The data writing operation described above will be described in detail with reference with FIG. 14.

When logical addresses used by a user are logical address '0' to logical address '5', logical address '0' to logical address '5' are all included in three pages according to the mapping table.

Therefore, the operating section 500 extracts address information having physical addresses according to pages from the address list, so that it is possible to write predetermined data into relevant physical addresses through only three repetitions of page accesses.

According to the present invention, physical addresses are classified according to pages each of which is a physical data operation unit, and a predetermined data operation is performed with respect to the classified physical addresses. Therefore, the data management device and method according to present invention can reduce time required for the data operation in a large-block flash memory, in which a physical data operation unit is larger than a logical data operation unit. As a result, the data management device and method according to present invention enable an optimal data operation.

Although exemplary embodiments of the present invention have been described for illustrative purposes, those skilled in the art will appreciate that various modifications, additions and substitutions are possible, without departing from the scope and spirit of the invention as disclosed in the accompanying claims. Accordingly, the scope of the invention is not to be limited by the exemplary embodiments but by the claims and the equivalents thereof.

What is claimed is:

1. A data management device for a flash memory which comprises a plurality of physical data operation units, wherein each of the physical data operation units includes a plurality of logical operation units, the data management device comprising;
    a converting section which converts logical addresses of a plurality of logical operation units into physical addresses of the logical operation units;
    a rearrangement section which rearranges the physical addresses and groups the physical addresses of the logical operation units according to their corresponding physical data operation units; and
    an operating section which extracts physical addresses, which have been rearranged and classified by the rearrangement section, included in one of the physical data operation units, and performs a predetermined data operation with respect to the physical addresses which have been extracted.

2. The data management device as claimed in claim 1, wherein the rearrangement section rearranges the physical address by creating an address list in which address information including the physical addresses and corresponding logical addresses are arranged according to a sequence of the physical addresses.

3. The data management device as claimed in claim 2, wherein each of the physical data operation units comprises a page, and the rearrangement section groups the physical addresses by grouping the address information included the address list according to pages.

4. The data management device as claimed in claim 3, wherein the operating section erases from the address list address information which has been extracted for performing the predetermined data operation.

5. The data management device as claimed in claim 1, wherein a physical data operation unit is made up of four logical operation units.

6. The data management device as claimed in claim 5, wherein a block is made up of thirty-two physical data operation units.

7. The data management device as claimed in claim 1, wherein a physical data operation unit is an operation unit used when a data operation is actually performed in the flash memory.

8. The data management device as claimed in claim 7, wherein a page is a minimum physical data operation unit.

9. The data management device as claimed in claim 8, wherein the page has a size of 2048 bytes.

10. The data management device as claimed in claim 1, wherein a logical operation unit is an operation unit used when a user performs data operations by means of a predetermined user program.

11. The data management device as claimed in claim 10, wherein a sector is a minimum logical operation unit.

12. The data management device as claimed in claim 11, wherein the sector has a size of 512 bytes.

13. A method of managing data in a flash memory which comprises a plurality of physical data operation units, wherein each of the physical data operation units includes a plurality of logical operation units, the method comprising:
    a) converting logical addresses of a plurality of logical operation units into physical addresses of the logical operation units;
    b) rearranging the physical addresses according to a sequence of the physical addresses; and
    c) grouping the physical addresses, which have been rearranged, according to their corresponding physical data operation units.

14. The method as claimed in claim 13, wherein step b) comprises:
    creating address information including the physical addresses and corresponding logical addresses; and
    creating an address list in which the created address information is arranged according to a sequence of the physical addresses, and
    wherein step c) comprises grouping the address information included the address list according to the physical data operation units.

15. The method as claimed in claim 14, further comprising:
    d) extracting address information included in one of the physical data operation units; and
    e) performing a data operation with respect to physical addresses corresponding to the address information which has been extracted.

16. The method as claimed in claim 15, wherein step e) further comprises erasing from the address list address information used for performing the data operation.

* * * * *